(12) United States Patent
Bernier et al.

(10) Patent No.: US 7,332,821 B2
(45) Date of Patent: Feb. 19, 2008

(54) COMPRESSIBLE FILMS SURROUNDING SOLDER CONNECTORS

(75) Inventors: William E. Bernier, Endwell, NY (US); Tien-Jen Cheng, Bedford, NY (US); Marie S. Cole, Wappingers Falls, NY (US); David E. Eichstadt, Chicago, IL (US); Mukta G. Farooq, Hopewell Junction, NY (US); John A. Fitzsimmons, Poughkeepsie, NY (US); Lewis S. Goldmann, Bedford, NY (US); John U. Knickerbocker, Wappingers Falls, NY (US); Tasha E. Lopez, Santa Ana, CA (US); David J. Welsh, Salt Point, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/711,076

(22) Filed: Aug. 20, 2004

(65) Prior Publication Data
US 2006/0040567 A1    Feb. 23, 2006

(51) Int. Cl.
*H01L 23/52* (2006.01)
*H01L 23/48* (2006.01)
*H01L 23/40* (2006.01)
*H01L 23/485* (2006.01)
*H01L 23/488* (2006.01)
*H01L 21/48* (2006.01)
*H01L 21/44* (2006.01)

(52) U.S. Cl. ............... 257/780; 257/778; 257/779; 257/E23.021; 257/E23.023; 257/738; 438/108; 438/612; 438/613

(58) Field of Classification Search ........ 257/737–738, 257/729, 734, 778–780, 781, 746, 760, 767, 257/741, 782, 784, 787–793, E23.021, E23.023; 438/612–613, 632, 108; 361/760, 762
See application file for complete search history.

(56) References Cited

U.S. PATENT DOCUMENTS

| | | | |
|---|---|---|---|
| 5,274,913 A | 1/1994 | Grebe et al. | |
| 6,100,114 A | 8/2000 | Milkovich et al. | |
| 6,281,452 B1 | 8/2001 | Prasad et al. | |
| 6,483,191 B2 | 11/2002 | Umezaki | |
| 6,573,122 B2 | 6/2003 | Standing | |
| 6,680,436 B2 * | 1/2004 | Xu et al. | 174/521 |
| 6,700,209 B1 * | 3/2004 | Raiser et al. | 257/790 |
| 6,921,860 B2 * | 7/2005 | Peterson et al. | 174/52.2 |
| 2002/0171152 A1 * | 11/2002 | Miyazaki | 257/778 |
| 2003/0230792 A1 | 12/2003 | Wu et al. | |
| 2005/0218517 A1 * | 10/2005 | Capote et al. | 257/738 |

FOREIGN PATENT DOCUMENTS

JP    2001127108    11/2001

\* cited by examiner

*Primary Examiner*—Luan Thai
(74) *Attorney, Agent, or Firm*—Gibb & Rahman, LLC; Joseph Petrokaitis, Esq.

(57) ABSTRACT

Disclosed is a method of forming an integrated circuit structure that forms lead-free connectors on a device, surrounds the lead-free connectors with a compressible film, connects the device to a carrier (the lead-free connectors electrically connect the device to the carrier), and fills the gaps between the carrier and the device with an insulating underfill.

21 Claims, 7 Drawing Sheets

COMPRESSIBLE FILMS SURROUNDING SOLDER CONNECTORS

BACKGROUND OF INVENTION

1. Field of Invention

The invention generally relates to connectors between devices and carriers and more particularly to connectors that are surrounded by compressible material that prevents delamination of the carrier from the device.

2. Description of the Related Art

Devices such as integrated circuit chips are often connected to carriers that include wiring connections to the integrated circuit chips. The integrated circuit chips can be connected to the carriers using a conductive lead solder. These lead connectors are generally formed as balls on the carrier and/or the chip. The carrier and chip are generally heated to cause the solder to melt, after which the structures are allowed to cool so the solder solidifies. This process is described as a "reflow" process and it bonds the lead solder connection to both the carrier and the chip.

Often, an insulating underfill material is used to fill in the remaining space between the device and the carrier. This underfill helps increase fatigue life of solder interconnections by absorbing some of the stress that results from the difference in the coefficients of thermal expansion of semiconductor devices and ceramic or organic carriers.

Though lead-containing solders have been used for decades and exhibit high yield and reliability due to their extensive utilization, worldwide legislation and environmental concerns have led to considerable interest in the development and use of lead-free solders. One such lead-free solder is SnAgCu, commonly called SAC, which is one of the leading alloys being considered as an alternative to solder connections containing lead. The SAC alloy (available with various levels of Ag and Cu, but typically ranging from 3-4% Ag and 0.5-1% Cu) has numerous advantages including a relatively low melting point, good fatigue life, and compatibility with common lead-free solders. Consequently, SAC is one of the leading candidates for lead-free interconnects between semiconductor devices and chip carriers.

One of the drawbacks in using lead-free solders is that their major constituents tend to experience a relatively large (e.g., 3%) volume expansion upon reflow. Unfortunately, the volume expansion of lead-free solders can force the underfill away from the solder connection, which prevents the underfill from being able to maintain support of the solder when the solder cools back to its original volume. As a result, this large volume expansion upon re-flow prevents some lead-free solders from being used on ceramic or organic carriers that require underfill.

SUMMARY OF INVENTION

Disclosed is a method of forming an integrated circuit structure, where the method forms lead-free connectors on a device, surrounds the lead-free connectors with a compressible film, connects the device to a carrier (the lead-free connectors electrically connect the device to the carrier), and fills the gaps between the carrier and the device with an insulating underfill.

The connectors can be reflowed by heating to melting, and then cooling. Some features of the embodiments herein are that the compressible film has a melting point above the lead-free connectors and the compressible film has sufficient compressibility to accommodate expansion of the lead-free connections when the lead-free connections are melted without damaging the underfill. Also, the process of surrounding the lead-free connectors with the compressible film can form the compressible film into a pattern between the carrier and the device where the compressible film is positioned around less than all the lead-free connections. This pattern can, for example, form channels between the device and the carrier, wherein the channels are filled with the underfill, or the pattern can comprise diagonal stripes of the compressible film.

The resulting structure has the device connected to the carrier by lead-free connectors with the compressible film surrounding (or partially surrounding) the lead-free connectors, and the insulating underfill filling gaps between the carrier and the device.

These, and other, aspects of the embodiments herein will be better appreciated and understood when considered in conjunction with the following description and the accompanying drawings. It should be understood, however, that the following description, while indicating embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF DRAWINGS

The invention will be better understood from the following detailed description with reference to the drawings, in which.

DETAILED DESCRIPTION

The present invention and the various features and advantageous details thereof are explained more fully with reference to the nonlimiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

The various embodiments herein use a compressible film around the device to carrier connection to provide a volume into which the lead-free solder (e.g., SAC alloy) can expand (before it reaches the underfill), thereby allowing the underfill to support the "bumps" even after numerous thermal excursions. The result is that lead-free solders can be used with all their advantages, without incurring the negative impact of lead-free solder volume expansion.

Figure 1:
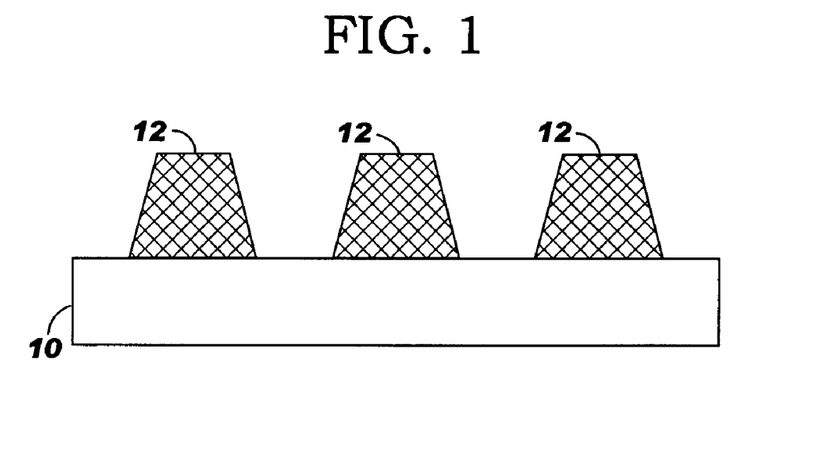
FIG. 1 is a schematic cross-sectional diagram of a partially completed device and carrier structure.

More specifically, as shown in FIG. 1, one embodiment forms lead-free connectors 12 on a device 10. Item 10 can comprise any type of device that is to be connected to any type of carrier. For example, item 10 could comprise an integrated circuit chip having functional devices therein. Alternatively, item 10 can represent the carrier, if the connectors 12 are formed on the carrier first. The connectors 12 are any type of electrically conductive connector that suffers from volume expansion upon reflow. For example, the connectors 12 can comprise a lead-free solder, such as the SAC alloy that is discussed above.

Figure 2:
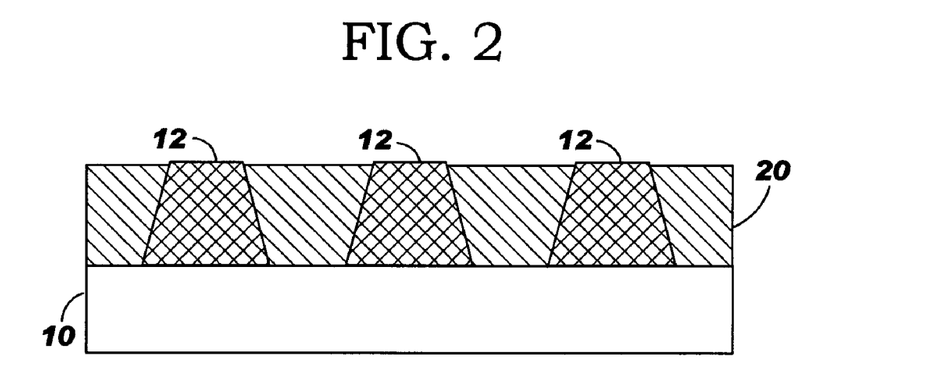
FIG. 2 is a schematic cross-sectional diagram of a partially completed device and carrier structure.

As shown in FIG. 2, in this embodiment, a compressible material 20 is formed to surround sides of the connectors 12. In one example, the compressible material 20 can be deposited at the level shown in FIG. 2. Alternatively, additional compressible material can be deposited and the structure can be planarized down to the level shown in FIG. 2. One feature is that the top of the connector 12 is exposed such that it can form an electrical connection to the carrier when it is attached to the carrier.

The compressible material 20 can be any compressible material, such as compressible silicone rubber, polyimide foam, or any other material that is thermally stable above the melting point of the connectors 12 (e.g., 260° C.) and has an expansion coefficient in the desired range for the expansion of each connector 12. One feature is that the compressible film 20 has sufficient compressibility to accommodate expansion of the connectors 12 when the connections are melted without damaging the underfill.

Figure 3:
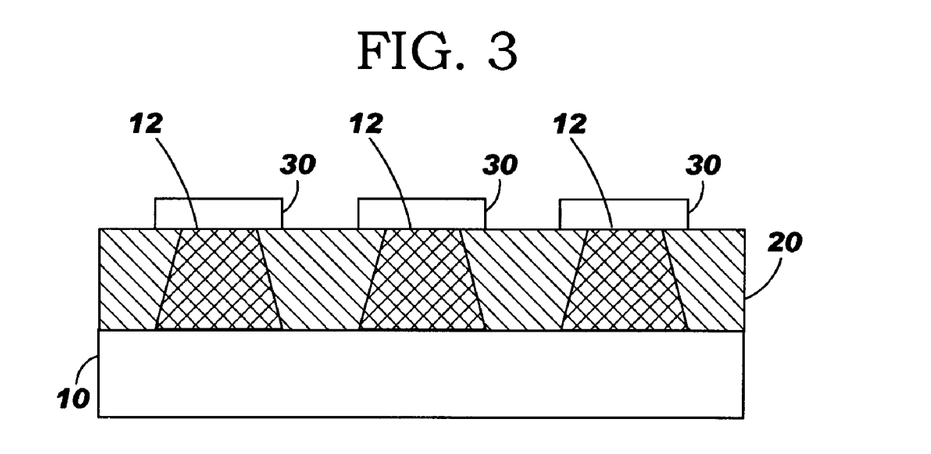
FIG. 3 is a schematic cross-sectional diagram of a partially completed device and carrier structure.
Figure 4:
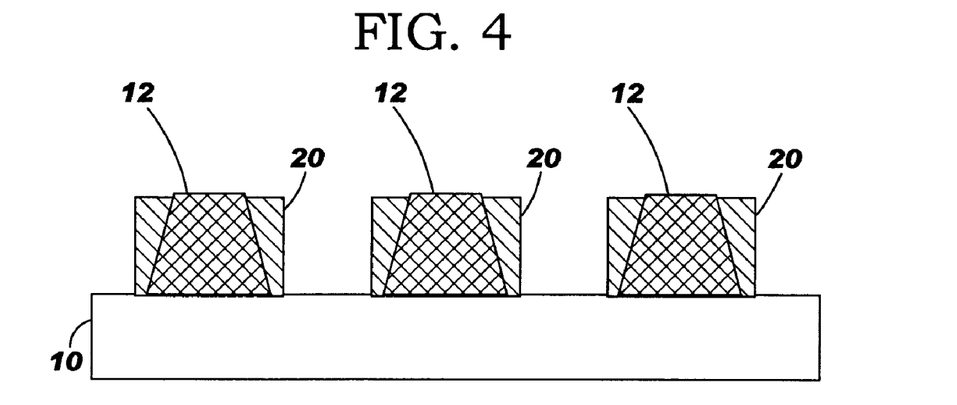
FIG. 4 is a schematic cross-sectional diagram of a partially completed device and carrier structure.
Figure 8:
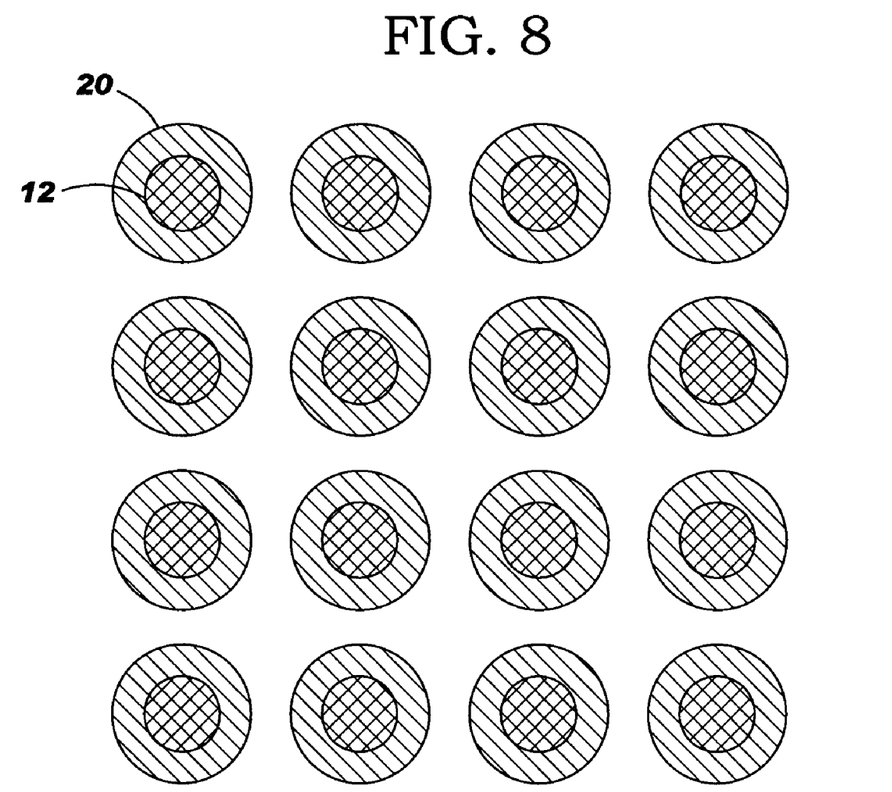
FIG. 8 is a schematic top-view diagram of one pattern of compressible material.
Figure 9:
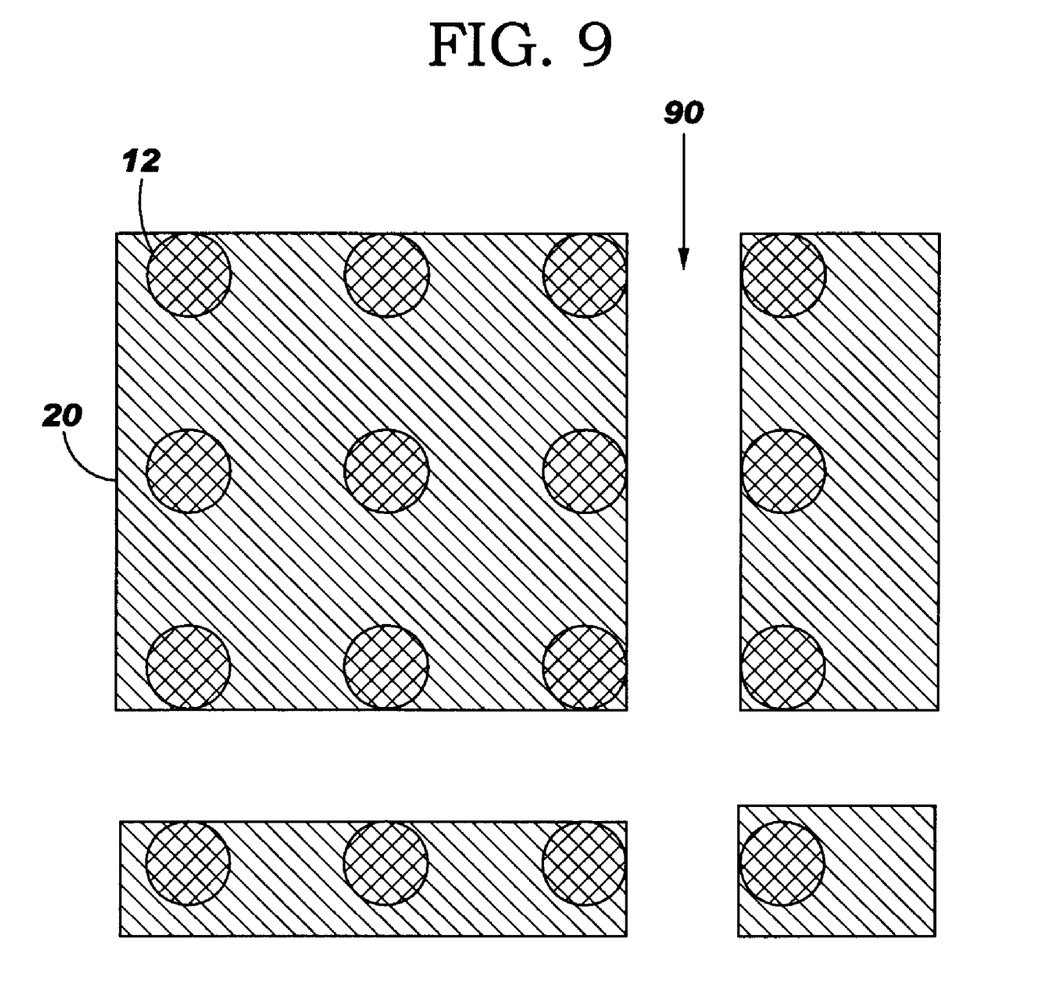
FIG. 9 is a schematic top-view diagram of one pattern of compressible material.
Figure 10:
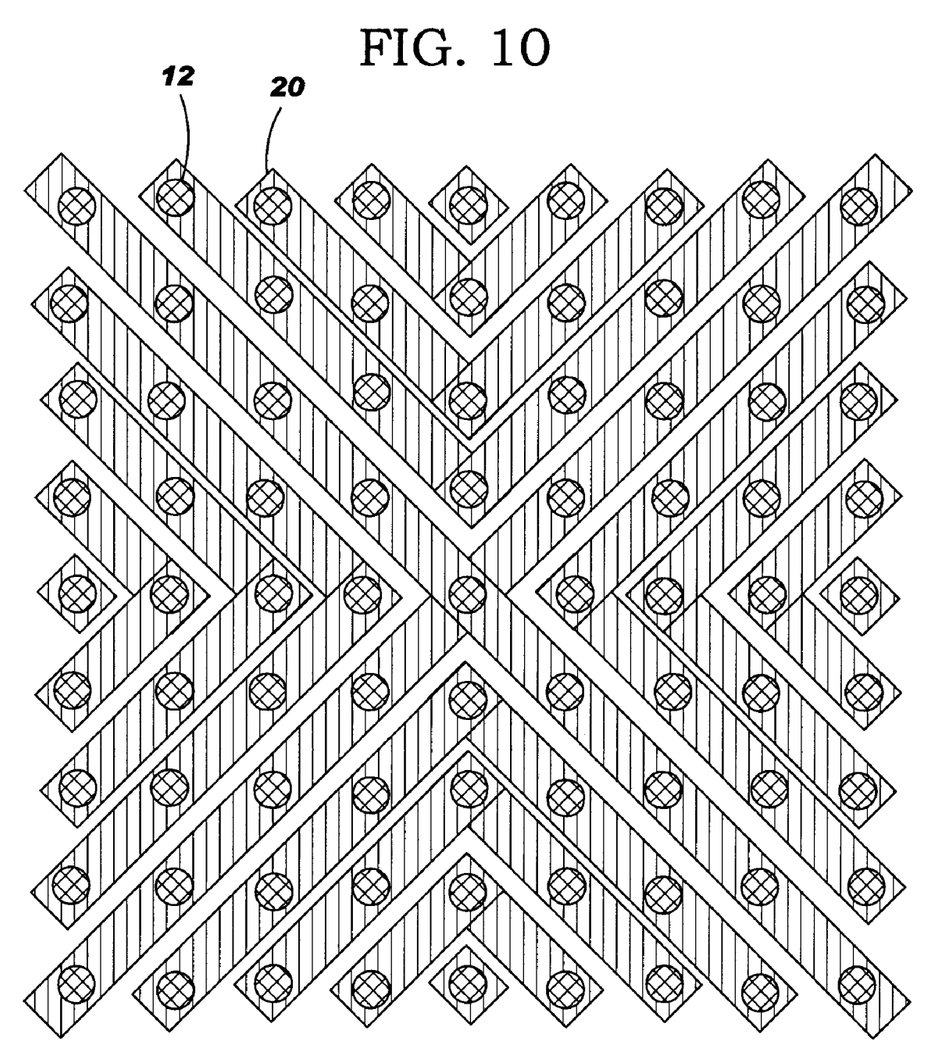
FIG. 10 is a schematic top-view diagram of one pattern of compressible material.

In FIG. 3, a mask 30 is formed using photolithographic techniques and, in FIG. 4, the compressible material 20 is patterned. This patterning process can be any conventional material removal process, such as etching, laser processing, and other similar methodologies. It is also possible that a photosensitive or electron-beam-sensitive compressible material 20 could be used, which would avoid the need to use the mask 30. Some of the possible patterns that the compressible material 20 can be patterned into are shown in FIGS. 8-10, and are discussed in greater detail below.

Figure 5:
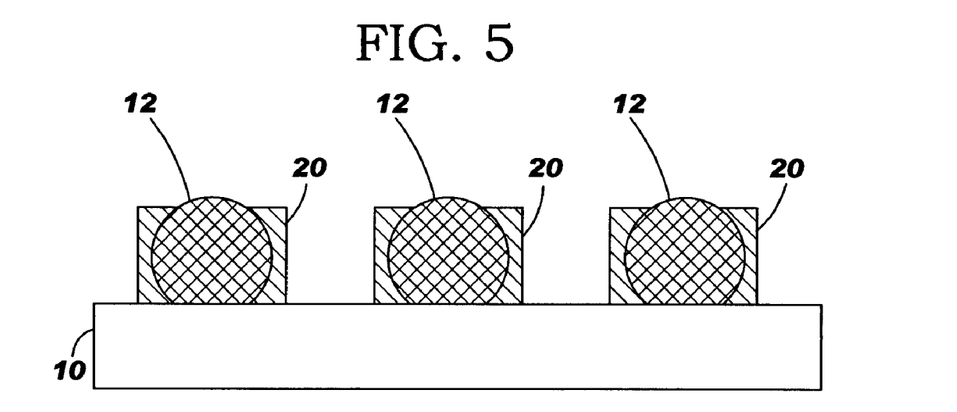
FIG. 5 is a schematic cross-sectional diagram of a partially completed device and carrier structure.

In FIGS. 1-4, the compressible material 20 is formed before the connectors 12 are reflowed into spheres. However, the compressible material 20 could be applied after the connectors 12 are reflowed into spheres, as shown in FIG. 5. Also note that FIG. 5 illustrates that in some embodiments, the compressible material 20 does not need to come up to the top of the connector 12. Instead, certain designs may see benefit from only using the compressible material 20 along a portion of the sides of the connectors 12.

Figure 6:
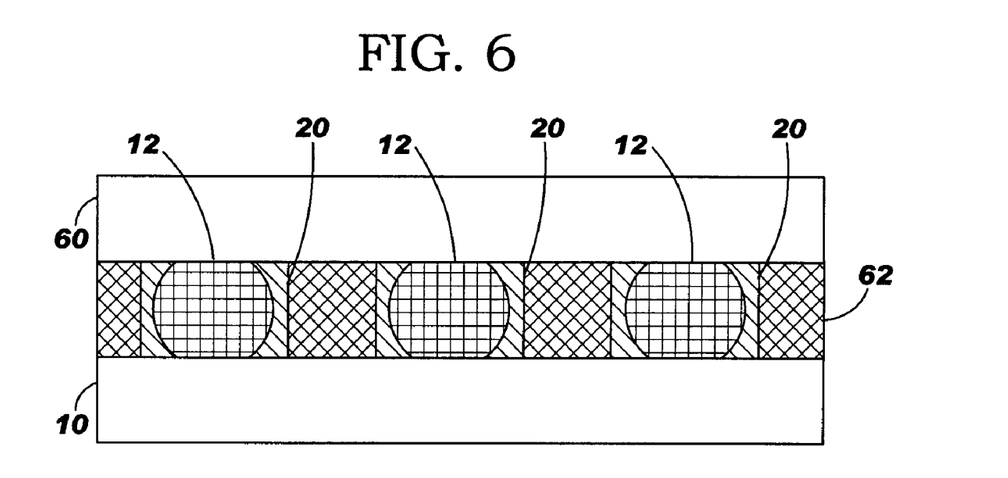
FIG. 6 is a schematic cross-sectional diagram of a partially completed device and carrier structure.

After the connectors 12 are surrounded with the compressible film 20, the device is connected to a carrier 60, as shown in FIG. 6. The connectors 12 electrically connect the device 10 to the carrier 60. Then, an insulating underfill 62 is deposited to fill the gap between the carrier 60 and the device 10. In the resulting structure, the device 10 is connected to the carrier 60 by connectors 12 with the compressible film 20 surrounding (or partially surrounding) the connectors 12, and the insulating underfill 62 filling gaps between the carrier 60 and the device 10.

Figure 7:
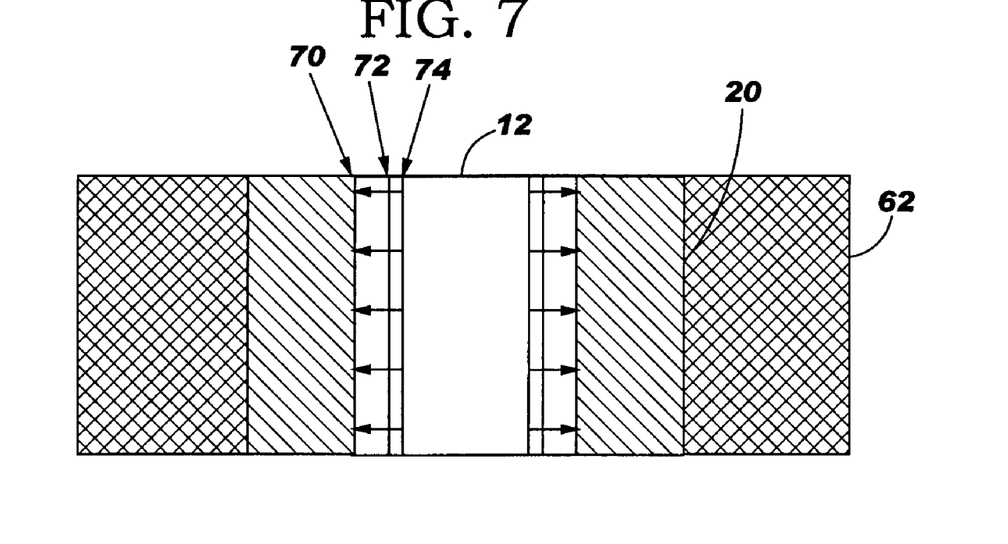
FIG. 7 is a schematic cross-sectional diagram of a connection structure.

FIG. 7 illustrates one of the connectors 12, the surrounding compressible film 20 and a portion of the underfill 62 in cross-section. FIG. 7 illustrates that the connector 12 can expand when heated and how it may expand permanently after being heated (reflowed). Note that FIG. 7 is not drawn to scale. In FIG. 7, line 74 illustrates the size of the connector 12 before heating, line 70 represents the size of the connector 12 when it is in a liquid or molten state (while it is being heated), and line 72 represents the size of the connector 12 after a reflow process. The compressible material 20 compresses to accommodate the change in size of the connector 12, which avoids deforming the underfill 62. This allows the underfill 62 to remain connected to the compressible material 20, the device 10, and the carrier 60 regardless of the expansion of the connector 12. Further, the compressible material 20 will allow further accommodation of volume expansion during other downstream high temperature processes (card assembly, rework, etc.) as well. With the inventive use of the compressible material 20, the underfill 62 will be able to provide the structural coupling required between the device and carrier.

As shown in FIG. 6, the compressible film 20 is patterned between the carrier 60 and the device 10. The patterns shown in FIG. 8-10 allow the underfill 62 to more easily fill all spaces between the carrier 60 and the device 10. Note that FIGS. 8-10 illustrate some exemplary patterns of the compressible material 20 and the invention is not strictly limited to these examples. In FIG. 8, the compressible material 20 forms a film around the ball or sphere shaped conductor connector 12. In FIG. 9, the compressible material 20 is patterned into squares or rectangles, thereby forming channels 90 through which the underfill 62 can be injected. This pattern can, for example, comprise diagonal stripes of the compressible film, as shown in FIG. 10. One feature of the pattern of the compressible material 20 is that it leaves sufficient room for the underfill material 62 to provide a good structural bond between the device 10 and the carrier 60. Note that while these examples show that all the connectors 12 have compressible film 20 thereon, in other embodiments, the compressible film 20 is positioned around less than all the connectors 12.

Figure 11:
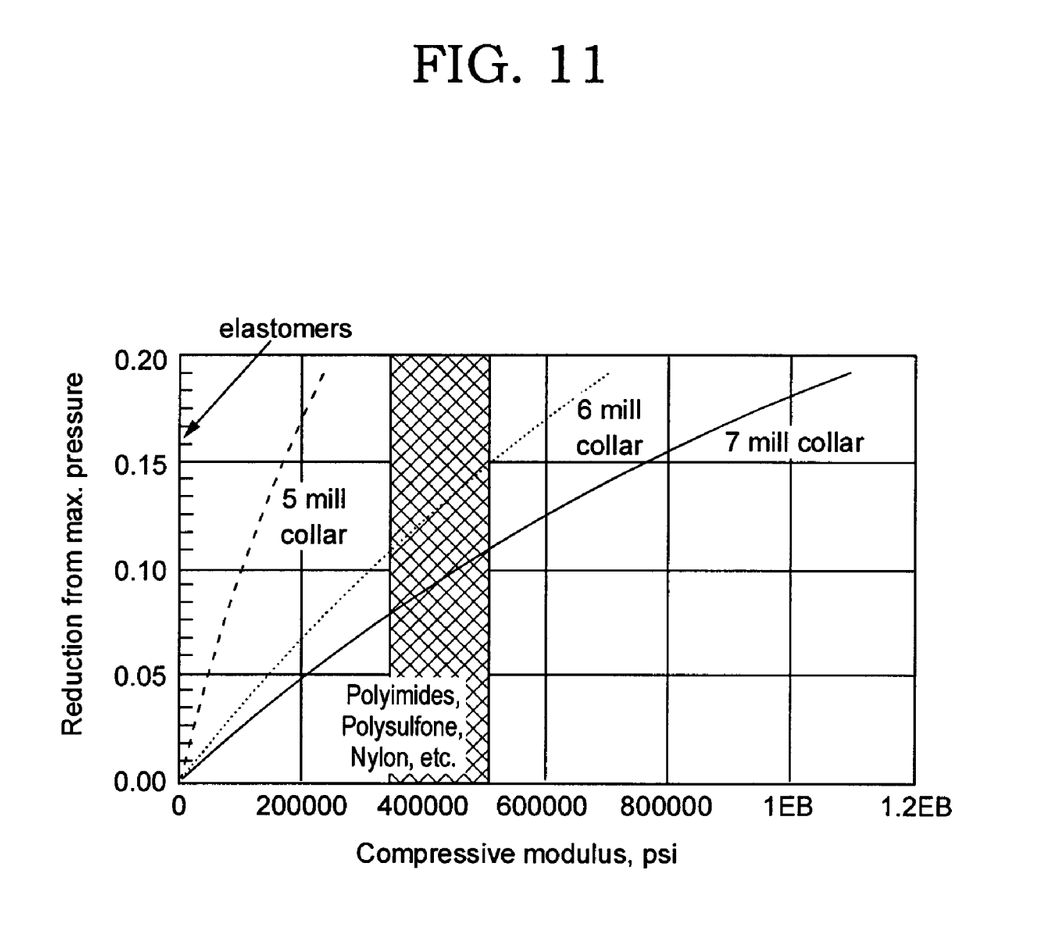
FIG. 11 is a graph showing the relationship between the reduction from maximum pressure verses the compressive modulus for different thicknesses of compressible material.

The makeup of the compressible film 20 that is used will vary depending upon the amount of compression that is needed in a specific design. In addition, the thickness of the compressible material 20 will vary, again, depending upon the amount of compression required. FIG. 11 is a graph showing the relationship between the reduction from maximum pressure verses the compressive modulus for different thicknesses of different compressible materials. The left side of the graph illustrates the range of elastomers while the center of the graph illustrates the range of polyimides, polysulfone, nylon, etc. In addition, the curves represent different thicknesses of the compressible material (e.g., 5, 6, and 7 mil). These curves represent that, as the compressible material is made thinner, it must be softer to provide the same degree of pressure reduction.

As mentioned above, the compressible material does not need to completely surround the sides of the connector 12. Covering only part of the ball height has significant advantages for flux removal and to facilitate underfill flow to narrow channels. However, pressure buildup will be greater as the entire connector ball 12 expands, but only a portion of its height can accommodate the extra volume. For example, if the compressible material comes up two-thirds of the ball height, the pressure would be 50% higher than if the compressed material covered the entire side of the connector 12. Thus, the specific material and thickness used will vary depending upon each design, as will the amount of the side of the connector that is covered.

Figure 12:
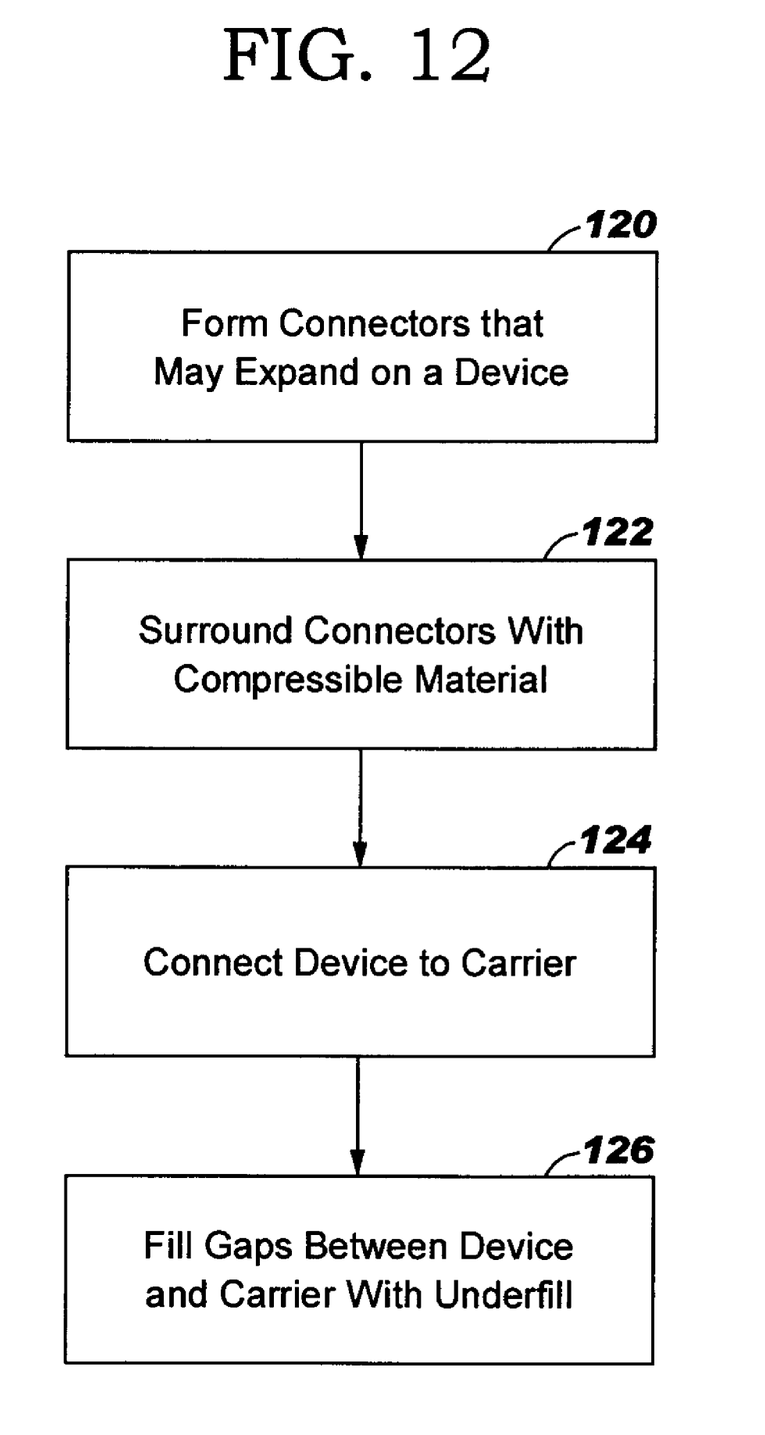
FIG. 12 is a flow diagram illustrating one embodiment.

FIG. 12 shows an embodiment in flowchart form. In FIG. 12, item 120 of this embodiment forms connectors that may expand on a device. In item 122, this embodiment surrounds the connectors with a compressible film. Next, in item 124, this embodiment connects the device to a carrier (the connectors electrically connect the device to the carrier). In item 126, this embodiment fills the gaps between the carrier and the device with an insulating underfill.

As shown above, various embodiments herein use a compressible film around the device to carrier connector to provide a volume into which the connector can expand (before it reaches the underfill), thereby allowing the underfill to support the device and carrier, even after numerous thermal excursions. The result is that lead-free solders (and other connector materials that suffer unwanted expansion upon heating) can be used with all their advantages, without incurring the negative impact of connector volume expansion.

While the invention has been described in terms of preferred embodiments, those skilled in the art will recognize that the invention can be practiced with modification within the spirit and scope of the appended claims.

The invention claimed is:

1. An integrated circuit structure comprising:
   a carrier;
   a device connected to said carrier;
   solder connectors electrically connecting said device to said carrier;
   a compressible film surrounding sides of said solder connectors, wherein said compressible film is stable above the melting point of said solder connectors, and wherein said compressible film remains compressible through more than one thermal excursion; and
   an insulating material surrounding said compressible film and filling gaps between said carrier and said device,
   wherein said compressible film has sufficient compressibility to accommodate expansion of said solder connectors when said solder connectors are melted without damaging said insulating material, and
   wherein said compressible film is between said solder connectors and said insulating material.

2. The structure in claim 1, all the limitations of which are incorporated herein by reference, wherein said compressible film forms a pattern between said carrier and said device.

3. The structure in claim 2, all the limitations of which are incorporated herein by reference, wherein said pattern has channels between said device and said carrier, wherein said channels are filled with said insulating material.

4. The structure in claim 2, all the limitations of which are incorporated herein by reference, wherein said pattern comprises diagonal stripes of said compressible film.

5. The structure in claim 2, all the limitations of which are incorporated herein by reference, wherein said pattern comprises rectangles of said compressible film.

6. The structure of claim 1, all the limitations of which are incorporated herein by reference, wherein said compressible film has sufficient compressibility to accommodate up to a 3% volume expansion of said solder connectors when said solder connectors are melted without damaging said insulating material.

7. The structure of claim 1, all the limitations of which are incorporated herein by reference, wherein said compressible film is distinct from said insulating material.

8. An integrated circuit structure comprising:
   a carrier;
   a device connected to said carrier;
   lead-free connectors electrically connecting said device to said carrier;
   a compressible film surrounding sides of said lead-free connectors, wherein said compressible film is stable above the melting point of said lead-free connectors, and wherein said compressible film remains compressible through more than one thermal excursion; and
   an insulating underfill surrounding said compressible film and filling gaps between said carrier and said device,
   wherein said compressible film has sufficient compressibility to accommodate up to a 3% volume expansion of said lead-free connectors when said lead-free connectors are melted without damaging said underfill, and
   wherein said compressible film is between said lead-free connectors and said insulating underfill.

9. The structure in claim 8, all the limitations of which are incorporated herein by reference, wherein said compressible film forms a pattern between said carrier and said device.

10. The structure in claim 9, all the limitations of which are incorporated herein by reference, wherein said pattern has channels between said device and said carrier, wherein said channels are filled with said underfill.

11. The structure in claim 9, all the limitations of which are incorporated herein by reference, wherein said pattern comprises diagonal stripes of said compressible film.

12. The structure in claim 9, all the limitations of which are incorporated herein by reference, wherein said pattern comprises rectangles of said compressible film.

13. The structure of claim 8, all the limitations of which are incorporated herein by reference, wherein said compressible film is distinct from said insulating underfill.

14. An integrated circuit structure comprising:
   a carrier;
   a device connected to said carrier;
   solder connectors electrically connecting said device to said carrier;
   a compressible film comprising one of a rubber and a foam surrounding sides of said solder connectors, wherein said compressible film is stable above the melting point of said solder connectors, and wherein said compressible film remains compressible through more than one thermal excursion; and
   an insulating material surrounding said compressible film and filling gaps between said carrier and said device,
   wherein said compressible film is between said solder connectors and said insulating material.

15. The structure in claim 14, all the limitations of which are incorporated herein by reference, wherein said compressible film has sufficient compressibility to accommodate expansion of said solder connectors when said solder connectors are melted without damaging said insulating material.

16. The structure of claim 15, all the limitations of which are incorporated herein by reference, wherein said compressible film has sufficient compressibility to accommodate up to a 3% volume expansion of said solder connectors when said solder connectors are melted without damaging said insulating material.

17. The structure in claim 14, all the limitations of which are incorporated herein by reference, wherein said compressible film forms a pattern between said carrier and said device.

18. The structure in claim 17, all the limitations of which are incorporated herein by reference, wherein said pattern has channels between said device and said carrier, wherein said channels are filled with said insulating material.

19. The structure in claim 17, all the limitations of which are incorporated herein by reference, wherein said pattern comprises diagonal stripes of said compressible film.

20. The structure in claim 17, all the limitations of which are incorporated herein by reference, wherein said pattern comprises rectangles of said compressible film.

21. The structure of claim 14, all the limitations of which are incorporated herein by reference, wherein said compressible film is distinct from said insulating material.

\* \* \* \* \*